United States Patent
Li et al.

(10) Patent No.: US 11,119,401 B2
(45) Date of Patent: *Sep. 14, 2021

(54) SIMULATING NEAR FIELD IMAGE IN OPTICAL LITHOGRAPHY

(71) Applicant: ASML US, LLC, Chandler, AZ (US)

(72) Inventors: Jiangwei Li, San Jose, CA (US); Yumin Wang, San Jose, CA (US); Jun Liu, San Jose, CA (US)

(73) Assignee: ASML US, LLC, Chandler, AZ (US)

( * ) Notice: Subject to any disclaimer, the term of this patent is extended or adjusted under 35 U.S.C. 154(b) by 0 days.

This patent is subject to a terminal disclaimer.

(21) Appl. No.: 16/617,304

(22) PCT Filed: Oct. 30, 2017

(86) PCT No.: PCT/US2017/059021
§ 371 (c)(1),
(2) Date: Nov. 26, 2019

(87) PCT Pub. No.: WO2018/217225
PCT Pub. Date: Nov. 29, 2018

(65) Prior Publication Data
US 2020/0166832 A1 May 28, 2020

Related U.S. Application Data

(63) Continuation of application No. 15/606,225, filed on May 26, 2017, now Pat. No. 10,209,615.

(51) Int. Cl.
*G03F 1/36* (2012.01)

(52) U.S. Cl.
CPC .................... *G03F 1/36* (2013.01)

(58) Field of Classification Search
CPC .... G03F 1/36; G03F 7/70283; G03F 7/70441; G03F 7/705; G03F 1/70; G06F 30/367
See application file for complete search history.

(56) References Cited

U.S. PATENT DOCUMENTS

| 7,703,069 | B1 | 4/2010 | Liu |
| 8,918,743 | B1 | 12/2014 | Yan et al. |
| 9,348,964 | B2 | 5/2016 | Zhang |

(Continued)

OTHER PUBLICATIONS

International Search Report dated Feb. 27, 2018 issued in corresponding International Patent Application No. PCT/US2017/059021.

(Continued)

*Primary Examiner* — Vuthe Siek
(74) *Attorney, Agent, or Firm* — Pillsbury Winthrop Shaw Pittman, LLP

(57) ABSTRACT

A method and an apparatus for determining near field images for optical lithography include receiving a thin mask image indicative of a photomask feature, in which the thin mask image is determined without considering a mask topography effect associated with the photomask feature, and determining a near field image from the thin mask image by a processor using an artificial neural network (ANN), in which the ANN uses data of the thin mask image as input. The apparatus includes a processor and a memory coupled to the processor. The memory is configured to store instructions executed by the processor to perform the method.

21 Claims, 9 Drawing Sheets

(56) References Cited

U.S. PATENT DOCUMENTS

| | | | |
|---|---|---|---|
| 9,448,252 B2 * | 9/2016 | Andreev | G01Q 60/22 |
| 9,818,212 B2 | 11/2017 | Jeon | |
| 9,922,291 B2 | 3/2018 | Fu | |
| 9,953,171 B2 | 4/2018 | Saxena | |
| 10,209,615 B2 | 2/2019 | Li et al. | |
| 10,580,130 B2 * | 3/2020 | Frangioni | G06T 7/90 |
| 10,671,786 B2 * | 6/2020 | Lai | G06F 30/367 |
| 2011/0177437 A1 | 7/2011 | Suh et al. | |
| 2014/0032199 A1 | 1/2014 | Deng et al. | |
| 2016/0290934 A1 | 10/2016 | Wells et al. | |
| 2016/0357900 A1 | 12/2016 | Liu et al. | |

OTHER PUBLICATIONS

Written Opinion of the International Searching Authority dated Feb. 27, 2018 issued in corresponding International Patent Application No. PCT/US2017/059021.

* cited by examiner

SIMULATING NEAR FIELD IMAGE IN OPTICAL LITHOGRAPHY

This application is the U.S. national phase entry of PCT Patent Application No. PCT/US2017/059021, filed on Oct. 30, 2017, which is a continuation of U.S. patent application Ser. No. 15/606,225, filed on May 26, 2017, now U.S. Pat. No. 10,209,615.

TECHNICAL FIELD

This disclosure relates to semiconductor fabrication, and particularly to determining near field images in optical lithography simulations.

BACKGROUND

Photolithography, also termed as "optical lithography" or "ultraviolet (UV, including deep ultraviolet, i.e. DUV, and extreme ultraviolet, i.e. EUV) photolithography," is a process used in microfabrication to pattern parts of a thin film onto a substrate. It uses light to transfer a desired geometric pattern from a "photomask" (or simply "mask") to a light-sensitive chemical "photoresist" (or simply "resist") onto a wafer substrate in an exposure pattern. A series of chemical treatments can then engrave the exposure pattern into, or enable deposition of a new material in the exposure pattern onto, the material underneath the photoresist. Photolithography can create small features (down to a few tens of nanometers in size), and is a cost-effective and reliable patterning technology in fabrication of very-large-scale integration (VLSI) devices down to sub-10 nm technology nodes. In integrated circuits (ICs) fabrication, a modern complementary metal-oxide-semiconductor (CMOS) wafer will go through photolithographic cycles for many times (e.g., 50 times) before a functional IC is formed.

During a photolithography process, light is shone onto a mask pattern which makes an imprint on a resist coated over a silicon wafer. The proper functioning of the circuit on the silicon wafer depends on the fidelity of transferring this pattern. Ideally, an output circuit patterned on the wafer is the same as the mask pattern. However, the imaging system is band-limited and can introduce distortions caused by diffraction effects of a lens-projection system, particularly when working at higher resolutions. For example, when wavelength of the light is 193 nm, with technology nodes of, such as, 45 nm, 32 nm or smaller, diffraction is bound to happen in a photolithography system. Thus, techniques are needed to remedy problems posed by sub-wavelength photolithography, such as optical proximity correction (OPC) or other resolution enhancement technologies (RET).

In addition, as demands for smaller and more uniform photomask features is rapidly increasing, the complexity of patterns is also increasing with the need for OPC and RET. These complex mask features demand higher accuracy in pattern placement and dimensional control.

Photolithography simulations incorporating OPC and RET techniques can be used for increased pattern complexity of mask patterns. In simulations for sub-wavelength photolithography, mask images considering near field effects due to mask topology or topography ("near field image") can be used.

SUMMARY

Disclosed herein are implementations of methods, apparatuses, and non-transitory computer-readable media for determining a near field image for optical lithography.

In an aspect, a method for determining a near field image for optical lithography is provided. The method includes receiving a thin mask image indicative of a photomask feature, wherein the thin mask image is determined without considering a near field effect associated with the photomask feature, and determining, from the thin mask image by a processor, a near field image using an artificial neural network (ANN), wherein the ANN uses the thin mask image as input.

Optionally, the photomask feature comprises at least one of: a mask pattern, an edge of the mask pattern, a corner of the mask pattern, and an area of the mask pattern.

Optionally, determining the near field image using the ANN comprises determining the near field image by adding the thin mask image to outputs of the ANN, wherein the outputs are indicative of difference between the thin mask image and the near field image and the ANN uses a vector image determined from the thin mask image as input.

Optionally, the ANN comprises at least one of multilayer perceptron (MLP) model and a convolutional neural network (CNN) model, input data for the ANN comprises image data of a sampled point of multiple sampled points in the thin mask image, and the image data comprises at least one of image intensity of the thin mask image at the sampled point, and a value of a vector image determined from the thin mask image.

Optionally, the multiple sampled points in the thin mask image are sampled in accordance with a sampling scheme comprising one of a concentric circle area sampling (CCAS), a concentric square sampling (CSS), and a uniform sampling.

Optionally, parameters associated with the ANN comprise a weight associated with the sampled point and the weight is determined based on a distance between the sampled point and another sampled point of the multiple sampled points.

Optionally, further comprises determining whether a match exists between the near field image determined using the ANN and a defined image indicative of the photomask feature, wherein the defined image is determined using a rigorous electromagnetic simulation technique; and based on a determination that no match exists between the near field image and the defined image, updating the parameters associated with the ANN.

Optionally, the method further comprises determining whether a cost value associated with the near field image is minimized and based on a determination that the cost value associated with the near field image is not minimized, updating the parameters associated with the ANN.

Optionally, the near field image comprises a complex value.

Optionally, determining the near field image using the ANN comprises determining gradient data associated with the near field image, wherein the gradient data comprises a gradient of the near field image with respect to the thin mask image.

In another aspect, an apparatus for determining a near field image for optical lithography is provided. The apparatus includes a processor and a memory coupled to the processor. The memory is configured to store instructions which when executed by the processor become operational with the processor to receive a thin mask image indicative of a photomask feature, wherein the thin mask image is determined without considering a near field effect associated with the photomask feature and the photomask feature comprises at least one of a mask pattern, an edge of the mask pattern, a corner of the mask pattern, and an area of the mask pattern, and determine, from the thin mask image, a near field image using an artificial neural network (ANN), wherein the ANN comprises at least one of multilayer perceptron (MLP) model and a convolutional neural network (CNN) model and the ANN uses the thin mask image as input.

Optionally, the instructions operational with the processor to determine the near field image using the ANN further comprise instructions to determine the near field image by adding the thin mask image to outputs of the ANN, wherein the outputs are indicative of difference between the thin mask image and the near field image, the ANN uses a vector image determined from the thin mask image as input, and the near field image comprises a complex value.

Optionally, input data for the ANN comprises image data of a sampled point of multiple sampled points sampled in the thin mask image in accordance with a sampling scheme comprising one of a concentric circle area sampling (CCAS), a concentric square sampling (CSS), and a uniform sampling, the image data comprises at least one of: image intensity of the thin mask image at the sampled point, and a value of a vector image determined from the thin mask image, and parameters associated with the ANN comprises a weight associated with the sampled point and the weight is determined based on a distance between the sampled point and another sampled point of the multiple sampled points.

Optionally, the instructions when executed by the processor become operational with the processor to determine whether a cost value associated with the near field image is minimized, and based on a determination that the cost value associated with the near field image is not minimized, update the parameters associated with the ANN.

Optionally, the instructions operational with the processor to determine the near field image using the ANN further comprise instructions to determine gradient data associated with the near field image, wherein the gradient data comprises a gradient of the near field image with respect to the thin mask image.

In another aspect, a non-transitory computer-readable medium is provided. The non-transitory computer-readable medium stores a set of instructions which when executed by an apparatus using a processor become operational with the processor for determining a near field image for optical lithography. The non-transitory computer-readable medium include instructions to receive a thin mask image indicative of a photomask feature, wherein the thin mask image is determined without considering a near field effect associated with the photomask feature and the photomask feature comprises at least one of a mask pattern, an edge of the mask pattern, a corner of the mask pattern, and an area of the mask pattern, and determine, from the thin mask image, a near field image using an artificial neural network (ANN), wherein the ANN comprises at least one of multilayer perceptron (MLP) model and a convolutional neural network (CNN) model and the ANN uses the thin mask image as input.

Optionally, the instructions to determine the near field image using the ANN further comprise instructions to determine the near field image by adding the thin mask image to outputs of the ANN, wherein the outputs are indicative of difference between the thin mask image and the near field image, the ANN uses a vector image determined from the thin mask image as input, and the near field image comprises a complex value.

Optionally, input data for the ANN comprises image data of a sampled point of multiple sampled points sampled in the thin mask image in accordance with a sampling scheme comprising one of a concentric circle area sampling (CCAS), a concentric square sampling (CSS), and a uniform sampling, the image data comprises at least one of: image intensity of the thin mask image at the sampled point, and a value of a vector image determined from the thin mask image, and parameters associated with the ANN comprises a weight associated with the sampled point and the weight is determined based on a distance between the sampled point and another sampled point of the multiple sampled points.

Optionally, instructions to determine whether a cost value associated with the near field image is minimized, and based on a determination that the cost value associated with the near field image is not minimized, update the parameters associated with the ANN.

Optionally, instructions to determine the near field image using the ANN further comprise instructions to determine gradient data associated with the near field image, wherein the gradient data comprises a gradient of the near field image with respect to the thin mask image.

BRIEF DESCRIPTION OF THE DRAWINGS

The disclosure is best understood from the following detailed description when read in conjunction with the accompanying drawings. It is emphasized that, according to common practice, the various features of the drawings are not to-scale. On the contrary, the dimensions of the various features are arbitrarily expanded or reduced for clarity.

DETAILED DESCRIPTION

Figure 1:
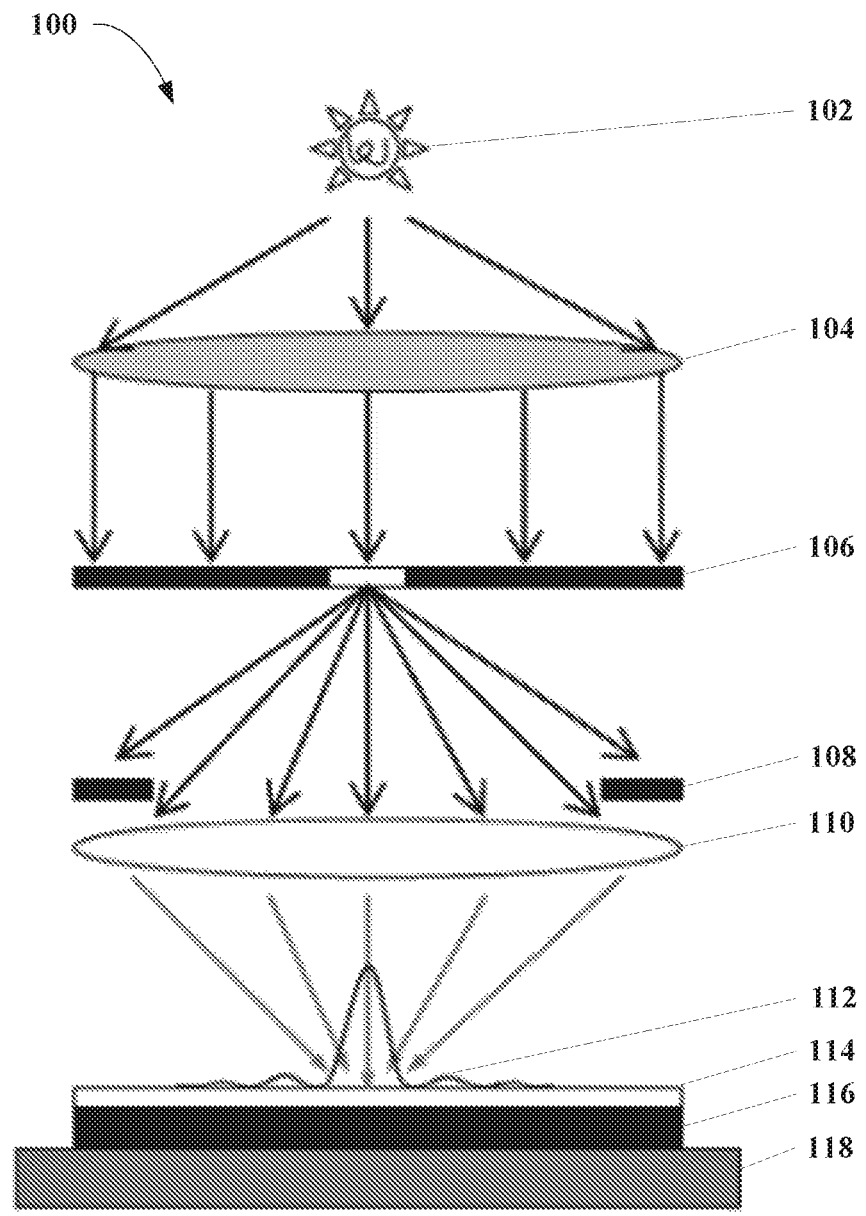
FIG. 1 is a diagram of an example photolithography system.

The detailed description of the present disclosure is presented largely in terms of procedures, steps, logic blocks, processing, or other symbolic representations. These descriptions and representations are typically used by those skilled in the art to most effectively convey the substance of their work to others skilled in the art. Numerous specific details are set forth in order to provide a thorough understanding of the present disclosure. However, it will become obvious to those skilled in the art that the present disclosure may be practiced without these specific details. In other instances, well known methods, procedures, components, and circuitry have not been described in detail to avoid unnecessarily obscuring aspects of the present disclosure.

Reference herein to "one implementation" or "an implementation" means that a particular feature, structure, or characteristic described in connection with the implementation can be included in at least one implementation of the disclosure. The appearances of the phrase "in one implementation" in various places in the specification are not necessarily all referring to the same implementation, nor are separate or alternative implementations mutually exclusive of other implementations.

This disclosure describes techniques with low computation cost, high efficiency, and sufficient accuracy in determining near field images for photolithography simulations in semiconductor fabrication.

Computational photolithography is a set of computer-based mathematical and algorithmic approaches (referred to as a "model") specifically designed to solve optical and process proximity problems and improve the attainable resolution in photolithography. The capability of the model to simulate the optical imaging system and predict the wafer patterns is essential, and tools can be built to compensate optical proximity effects and enable RET. With increasing accuracy demands for pattern placement and dimension control on wafer, the error budget for the simulation system, or the model, is becoming tighter. Besides accuracy, the computational photolithography tools also face challenges to handle an enormous amount of design data. Even with techniques such as distributed computing on thousands of computer cores, fast algorithm is still important for photolithography models.

In a standard framework commonly employed in fast computational photolithography models, an image representing the mask patterns (referred to as a "mask image") is created from computer-stored data files. The mask image can be projected to an optical intensity profile (referred to as an "aerial image"), onto the surface of the wafer. This projection can be described by a light-source-dependent projection function (referred to as a "pupil function"). When the source is incoherent and has a shape consisting of a region on a plane of the source, aerial images resulting from sampled points of the light source can be summed to produce a total aerial image, which determines final patterns projected on the wafer. This scheme can be modified under some assumptions and through various derivations for speed improvement. However, the mask image remains the starting point of the simulation. It is important to have the mask image as accurate as possible so that the demanded accuracy of the model can be achieved. Specifically, accurate modeling of interactions between incident light and three-dimensional (3D) mask topology/topography is becoming increasingly important as the dimensions of the mask patterns are comparable to the wavelengths of light/illumination used for optical lithography.

FIG. 1 shows an example photolithography system as an example. Light from a light source 102 passes through a condenser lens system 104, and illuminates a mask 106. In some implementations, based on light transmission, the mask 106 can have different transmittances in different regions respectively corresponding to different desired features on a silicon wafer. After passing through the mask 106 and an aperture 108, the light is captured by an objective lens system 110 and forms an aerial image 112 incident onto a photoresist 114 coated upon the silicon wafer that includes a first layer 116 (e.g., a silicon layer) and a second layer 118. Depending on chemical nature of the photoresist, the incident light can produce chemical changes in (or "modify") exposed sections of the photoresist 114. The modified photoresist can be removed by a chemical solution (referred to as a "developer") to expose sections of the first layer 116 in the desired patterns. The exposed sections of the first layer 116 can be etched away by an acid, while the unexposed sections of the first layer 116 can be protected by the remaining (un-modified) photoresist layer. After the etching, the remaining photoresist can be removed by a chemical (referred to as a "resist stripper"). As a result, the features on the mask can be transferred to the silicon wafer.

In some implementations, the mask 106 (e.g., an EUV mask) can be based on Bragg reflection (e.g., a Bragg reflector), which can be a stack or multiple reflective layers (referred to as a "multilayer stack") covered by an absorber layer with patterns. For a Bragg reflector, the incidence light can be reflected by the multilayer stack and modulated by the absorber layer to present the desired features on the silicon wafer. In accordance with the reflective mask 106, the objective lens system 110 can be replaced by an illuminator system (not shown) for reflecting and focusing the reflected light from the reflective mask 106 to the photoresist 114.

FIG. 1 shows a cross section of the mask 106 that is used in optical lithography (referred to as an "optical mask"). The pattern on the mask can originate from a computerized data file. A mask writing process converts the geometric pattern into transmittance modulations on the mask. The transmittance modulations are achieved by disposing different materials in different mask regions, or varying thickness of the materials. During the mask writing process, the computerized data file can be converted to a series of polygons and written through a photolithographic or electron-beam lithographic process onto a mask blank (e.g., a quartz substrate covered with a layer of chromium). A laser beam (referred to as a "laser writer") or a beam of electrons (referred to as a "e-beam writer") can be used to expose the pattern defined by the data file onto the surface of the quartz substrate, travelling over the surface of the mask blank in either a vector or raster scan manner. When the photoresist on the mask is exposed, the chromium layer can be etched away, leaving a clear path for the light in the stepper/scanner system to travel through.

OPC is a photolithography enhancement technique commonly used to improve edge integrity of processed original design (layout) placed into the etched image on the silicon wafer. OPC can compensate for image errors due to both optical (e.g., diffraction) or physical/process (e.g., resist and etch) effects. OPC can manipulate amplitudes of wave fronts of light, allowing more or less amount of light to travel through, to counteract imaging effects that distort the reproduced patterns on the wafer. The idea of OPC is to pre-compensate for the process losses by modifying original layout, which can improve pattern transfer fidelity and resolution. For example, OPC techniques can include lengthening features, displacing edges of a pattern (referred to as "edge-biasing"), and creating serifs to reduce corner rounding. Another OPC technique can include adding sub-resolution assistant features (SRAF) to the original layout, which are very small features with dimensions below resolution of the imaging system.

In model-based OPC processes, a lithographic model can be built to simulate the optical or electromagnetic near field due to proximity to mask topology or topography features (e.g., thickness and topographical structures). The effects on the optical or electromagnetic near field due to the proximity to the mask topography features can be referred to as "mask topography effects" hereinafter. For example, the mask topography effects can consider materials, thickness, and sidewall angles or layer differences in a photomask stack. This model can take a representation of mask patterns and calculate an optical aerial image, and predict patterns formed on the photoresist. Errors from comparing the predicted patterns with the desired patterns (design target) can be extracted to determine directions and step sizes for correction. In conventional lithographic models, the mask is ideally considered as a thin layer, in which its thickness and topographical structures are ignored. This thin layer can be simulated by building a two-dimensional image (referred to as a "thin mask image") through rendering and low-pass filtering (also called "blurring" or "smoothing") for noise reduction. In some implementations, the thin mask image can be pixelated. In some implementations, the thin mask image can be gray-scale. Rasterization techniques from image processing can be used, which can convert a vector graphics format of the geometry shapes of the patterns into a pixelated raster image format. However, this approach has been proven not accurate enough for sub-wavelength technology nodes.

To simulate the near field due to mask thickness and topographical structures, a first principle is to solve Maxwell's equations. Due to a complicated shape of the light source and complex boundary conditions defined by mask patterns, the Maxwell's equations can typically be solved numerically only. Several rigorous numerical methods (referred to as "rigorous solvers") can be used to solve Maxwell's equations, such as Finite-Difference Time-Domain (FDTD) method and Rigorously Coupled Wave Analysis (RCWA) method. The mask image with mask topography effects (referred to as a "near field image" or a "thick mask image") from the rigorous solvers can be inserted into the pupil function to determine the aerial image. Although the rigorous solvers can generate relatively accurate simulation results, in some cases, it is difficult to compute the near field image for a full chip, due to the computing capability of the rigorous solvers is limited.

A library-based approach can be used to speed up the rigorous solvers to compute the near field image for OPC and other RET applications. The library-based approach can solve Maxwell's equations for selected simple patterns, crop a resulted near field image that covers a region surrounding a single geometry (e.g., a single edge or a single corner), and record the resulted near field image into a library database. The database clips of geometry-centered (e.g., edge-centered or corner-centered) near field images are called geometry filters (e.g., edge filters or corner filters), which can be stored in a digital file storing system. Database clips of near field images with other geometries (e.g., areas or other geometric features of the mask patterns) centered are also possible, which can be collectively called "Mask Topography filters." In the library-based approach, when an OPC model is used to simulate a near field image of a complex pattern for a semiconductor chip, the OPC model can determine (e.g., loop through) all edges and corners on the layout of the chip, look up corresponding recorded edge filters and corner filters in the library, and copy the corresponding edge-centered or corner-centered near field images to assemble the near field image for the chip. Although faster than the rigorous solvers with sufficient accuracy, the library-based approach cannot support unlimited geometric features of patterns (e.g., unlimited edge directions and feature sizes). For example, if the library is built for edges in selected orientations, it cannot be used to accurately simulate the near field image for edges in orientations other than the selected ones. In addition, the near field image not only depends on geometries (e.g., edges or corners), but also is affected by adjacent patterns. When an inter-geometry distance (e.g., an edge-to-edge, edge-to-corner, or corner-to-corner distance) is so small that secondary optical scattering effects can significantly change the near field, or when accuracy requirement is so high that numerous segments and shapes of the layout are involved, the library-based approach can face high dimensionality and complexity, in which the size and structure of the library database can be largely increased.

According to implementations of this disclosure, a near field image ($MI_{3D}$) considering effects due to mask topology or topography (e.g., thickness and topographical structures) can be obtained by processing a thin mask image ($MI_{2D}$) through an artificial neural network (ANN). In some implementations, $MI_{3D}$ can be predicated using the ANN with $MI_{2D}$ as the only input. $MI_{2D}$ and $MI_{3D}$ can be real-valued images. $MI_{2D}$ can be a gray-scale image resulted from rasterization. $MI_{3D}$ can also be a complex-valued image that can represent non-zero phase variations from optical scattering effects at the mask surfaces. The ANN can predict $MI_{3D}$ from information carried in $MI_{2D}$ with optical scattering effects from the edges, corners and their interactions in between evaluated. Compared to the rigorous solvers and library-based methods, the processing speed of the ANN can suffice to be used in an automatic photolithography system. In addition, the ANN can be independent of pattern density of mask design layouts. By using the ANN, support for mask patterns are not limited to certain edge directions or feature sizes, while accuracy of the predicted near field image can be up to a level suitable for OPC modeling. $MI_{3D}$ can be inputted into the pupil function of a photolithography simulation model to determine the aerial image.

Figure 2:
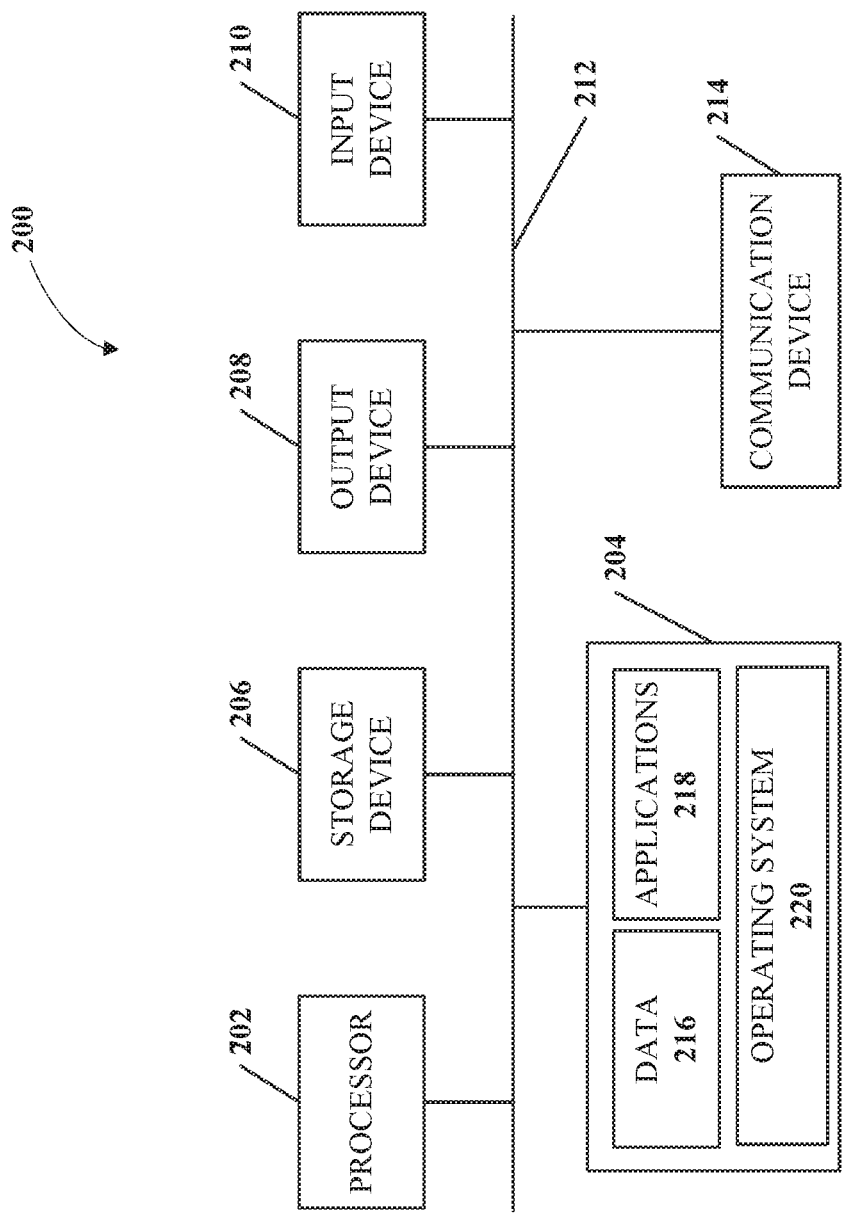
FIG. 2 is a diagram of an example apparatus for optical lithography simulation according to implementations of this disclosure.

FIG. 2 is a diagram of an example apparatus 200 for optical lithography simulation according to implementations of this disclosure. The apparatus 200 can be used for determining a near field image, which can be implemented as an integral part of the apparatus 200. In some implementations, the apparatus 200 can be implemented using general purpose computers/processors with a computer program that, when executed, carries out any of the respective methods, algorithms and/or instructions described herein. In addition or alternatively, for example, special purpose computers/processors can be utilized which can contain specialized hardware for carrying out any of the methods, algorithms, or instructions described herein.

The apparatus 200 can include a computing device, which can be implemented by any configuration of one or more computers, such as a microcomputer, a mainframe computer, a super computer, a general-purpose computer, a special-purpose/dedicated computer, an integrated computer, a database computer, a remote server computer, a personal computer, or a computing service provided by a computing service provider, e.g., a web host, or a cloud service provider. In some implementations, the computing device can be implemented in the form of multiple groups of computers that are at different geographic locations and can or cannot communicate with one another, such as by way of a network. While certain operations can be shared by multiple computers, in some implementations, different computers are assigned different operations.

The apparatus 200 can have an internal configuration of hardware including a processor 202 and a memory 204. The processor 202 can be any type of device or devices capable of manipulating or processing information. In some implementations, the processor 202 can include a central processor (e.g., a central processing unit or CPU). In some implementations, the processor 202 can include a graphics processor (e.g., a graphics processing unit or GPU). Although the examples herein can be practiced with a single processor as shown, advantages in speed and efficiency can be achieved using more than one processor. For example, the processor 202 can be distributed across multiple machines or devices (each machine or device having one or more of processors) that can be coupled directly or connected across a local area network or other networks. The memory 204 can be any device or devices capable of storing codes and data that can be accessed by the processor (e.g., via a bus). For example, the memory 204 can be accessed by the processor 202 via a bus 212. Although a single bus 212 is shown, multiple buses can be utilized. The memory 204 herein can be a random access memory device (RAM), a read-only memory device (ROM), an optical/magnetic disc, a hard drive, a solid state drive, a flash drive, a security digital (SD) card, a memory stick, a compact flash (CF) card, or any combination of any suitable type of storage device. In some implementations, the memory 204 can be distributed across multiple machines or devices, such as a network-based memory or cloud-based memory. The memory 204 can include data 216, an operating system 220 and an application 218. The data 216 can be any data for photolithography simulation (e.g., computerized data files of mask design layout or database clips of Mask Topography filters). The application 218 can include programs that permit the processor 202 to implement instructions to generate control signals for performing functions of determining the near field image as described herein, such as the processes 700, 300, or 600.

In some implementations, besides the processor 202 and the memory 204, the apparatus 200 can also include a secondary, additional or external storage device 206. When present, the storage device 206 can provide additional memory when high processing requirements exist. The secondary storage device 206 can be a storage device in the form of any suitable non-transitory computer readable medium, such as a memory card, a hard disc drive, a solid state drive, a flash drive or an optical drive. Further, the storage device 206 can be a component of the apparatus 200 or can be a shared device that is accessed via a network. In some implementations, the application 218 can be stored in whole or in part in the storage device 206 and loaded into the memory 204 as needed for processing.

In some implementations, besides the processor 202 and the memory 204, the apparatus 200 can include an output device 208. The output device 208 can be implemented in various ways, for example, it can be a display that can be coupled to the apparatus 200 and configured to display a rendering of graphic data. The output device 208 can be any device transmitting a visual, acoustic, or tactile signal to a user, such as a display, a touch sensitive device (e.g., a touch screen), a speaker, an earphone, a light-emitting diode (LED) indicator, or a vibration motor. If the output device 208 is a display, for example, it can be a liquid crystal display (LCD), a cathode-ray tube (CRT), or any other output device capable of providing visible output to an individual. In some cases, an output device can also function as an input device—a touch screen display configured to receive touch-based input, for example.

The output device 208 can alternatively or additionally be formed of a communication device for transmitting signals and/or data. For example, the output device 208 can include a wired mean for transmitting signals or data from the apparatus 200 to another device. For another example, the output device 208 can include a wireless transmitter using a protocol compatible with a wireless receiver to transmit signals from the apparatus 200 to another device.

In some implementations, besides the processor 202 and the memory 204, the apparatus 200 can include an input device 210. The input device 210 can be implemented in various ways, such as a keyboard, a numerical keypad, a mouse, a trackball, a microphone, a touch sensitive device (e.g., a touch screen), a sensor, or a gesture-sensitive input device. Any type of input device not requiring user intervention is also possible. For example, the input device 210 can be a communication device such as a wireless receiver operating according to any wireless protocol for receiving signals. The input device 210 can output signals or data, indicative of the inputs, to the apparatus 200, e.g., via the bus 212.

In some implementations, besides the processor 202 and the memory 204, the apparatus 200 can include a communication device 214 to communicate with another device (e.g., a computer storing a design database for photolithography), such as, via a network (not shown). The network can be one or more communications networks of any suitable type in any combination, including, but not limited to, networks using Bluetooth communications, infrared communications, near field connections (NFC), wireless networks, wired networks, local area networks (LAN), wide area networks (WAN), virtual private network (VPN), cellular data networks and the Internet. The communication device 214 can be implemented in various ways, such as a transponder/transceiver device, a modem, a router, a gateway, a circuit, a chip, a wired network adapter, a wireless network adapter, a Bluetooth adapter, an infrared adapter, an NFC adapter, a cellular network chip, or any suitable type of device in any combination that is coupled to the apparatus 200 using the bus 212 to provide functions of communication with the network.

The apparatus 200 (and algorithms, methods, instructions etc. stored thereon and/or executed thereby) can be realized in hardware including, for example, intellectual property (IP) cores, application-specific integrated circuits (ASICs), programmable logic arrays, optical processors, programmable logic controllers, microcode, firmware, microcontrollers, servers, microprocessors, digital signal processors or any other suitable circuit. In the claims, the term "processor" should be understood as encompassing any the foregoing, either singly or in combination. The terms "signal" and "data" are used interchangeably. Further, components of the apparatus 200 do not necessarily have to be implemented in the same manner.

According to implementations of this disclosure, the near field image ($MI_{3D}$) can be obtained from a thin mask image ($MI_{2D}$) based on an image processing method.

In principle, the $MI_{3D}$ can be obtained from the $MI_{2D}$ using the Mask Topography filters (e.g., gradient filters and curvature filters). Some image processing methods, referred to as "geometry detectors," can detect geometric features from $MI_{2D}$. For example, gradient detectors and curvature detectors can detect edges and corners, respectively. The Mask Topography filters can filter the edges and corners to account for mask topography effects and determine geometric data. For example, the geometric data can include a partial near filed image centered on an edge or a corner. The outputs of the Mask Topography filters (e.g., corner-centered and edge-centered partial near field images) can be summed with $MI_{2D}$ to determine $MI_{3D}$.

The above principle can be described as follows. In Eq. (1):

$$MI_{filtered} = MI_{layout} + MI_{layout} \otimes g \otimes k \qquad (1)$$
$$= MI_{layout} + MI_{geometries} \otimes k$$

$MI_{filtered}$ is a near field image with no standard filters (e.g., a low-pass filter) applied, $MI_{layout}$ is polygons included in the mask design layout data, g is geometry detectors, $MI_{geometries}$ are detected geometries (e.g., edges and corners), and k is Mask Topography filters.

To determine $MI_{3D}$, the standard filters h can be applied to $MI_{filtered}$, which can be shown as Eq. (2):

$$MI_{3D} = MI_{filtered} \otimes h \qquad (2)$$
$$= (MI_{layout} + MI_{geometries} \otimes k) \otimes h$$
$$= MI_{layout} \otimes h + MI_{geometries} \otimes k \otimes h$$
$$= MI_{layout} \otimes h + MI_{layout} \otimes g \otimes k \otimes h$$
$$= MI_{layout} \otimes h + MI_{layout} \otimes h \otimes g \otimes k$$
$$= MI_{2D} + MI_{2D} \otimes g \otimes k$$
$$= MI_{2D} + MI_{2D}^{geometries} \otimes k$$

where $MI_{2D} = MI_{layout} \otimes h$, and $MI_{2D}^{geometries} = MI_{2D} \otimes g$.

As shown in Eq. (1)-(2), $MI_{3D}$ can be determined using $MI_{2D}$ and outputs of $MI_{2D}$ filtered by Mask Topography filters. In some cases, analytical forms of the Mask Topography filters are difficult to obtain or have limitations. For those cases, a learning method can be used as numerical forms of the Mask Topography filters. For example, the learning method can include an ANN model.

Figure 3A:
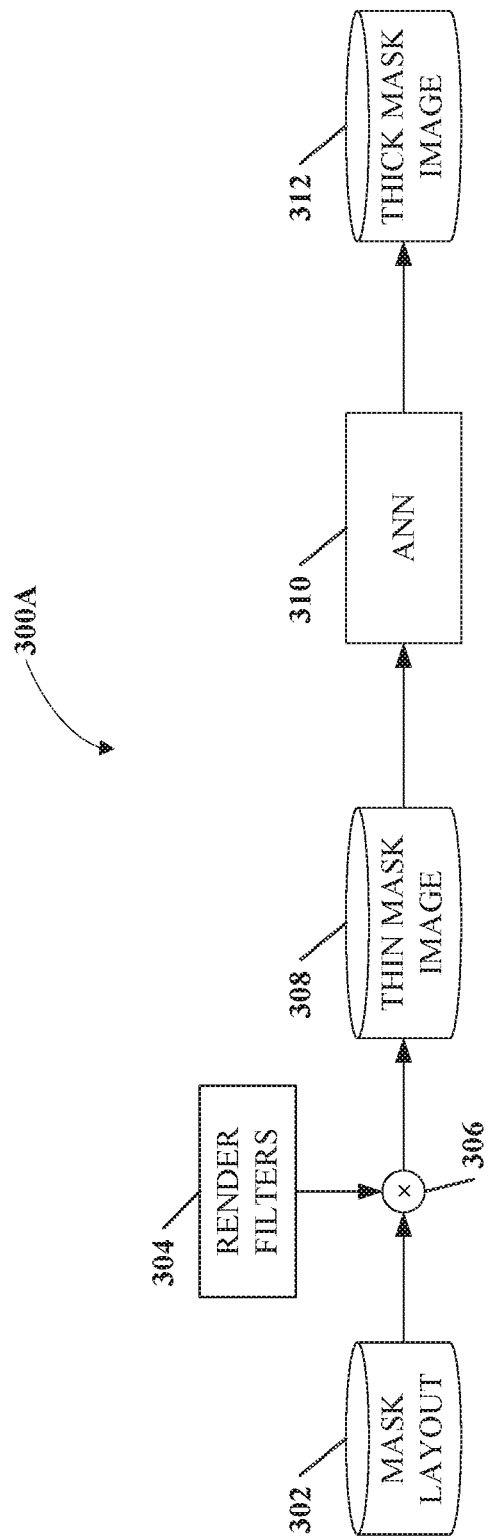
FIG. 3A is a diagram of an example process for determining a near field image according to implementations of this disclosure.

FIG. 3A is a diagram of an example process 300A for determining a near field image ($MI_{3D}$) according to implementations of this disclosure. The process 300A can be implemented as software and/or hardware in the apparatus 200 in FIG. 2. For example, the process 300A can be implemented by program codes stored in a memory (e.g., the memory 204). The program codes can include computer-readable instructions that, when executed by a processor (e.g., the processor 202), cause the apparatus to determine $MI_{3D}$ in the manner described in FIG. 3A. The process 300A can also be implemented as specialized hardware included in an apparatus (e.g., the apparatus 200). The process 300A includes data and operations 302-312, which are set forth as follows.

Mask design layout data (referred to as a "mask layout") 302 can be inputted to the process 300A. The mask layout 302 can include geometric information of mask patterns. For example, the mask layout 302 can include a series of polygons. The mask layout 302 can be stored as one or more computerized data files.

Various render filters (e.g., a low-pass filter) 304 can render the mask layout 302 (e.g., polygons) at operation 306 (e.g., a convolution operation). The thin mask image 308 (e.g., a pixelated thin mask image) can be outputted from the operation 306. For example, the operation 306 can include a rasterization operation to generate the thin mask image 308. The thin mask image 308 can carry information of all edges and corners as well as their neighboring features of mask patterns.

An ANN model 310 can take the thin mask image 308 as input and output a thick mask image 312. For example, if the ANN uses a multilayer perceptron (MLP) model, the thin mask image 308 can be flattened before inputted into the ANN. For another example, if the ANN uses a convolutional neural network (CNN) model, the thin mask image 308 can be scanned by a square region (a CNN kernel) to generate a set of sub-images, and the sub-images can be used as input of the CNN model. The ANN model will be detailed in FIG. 4.

Figure 3B:
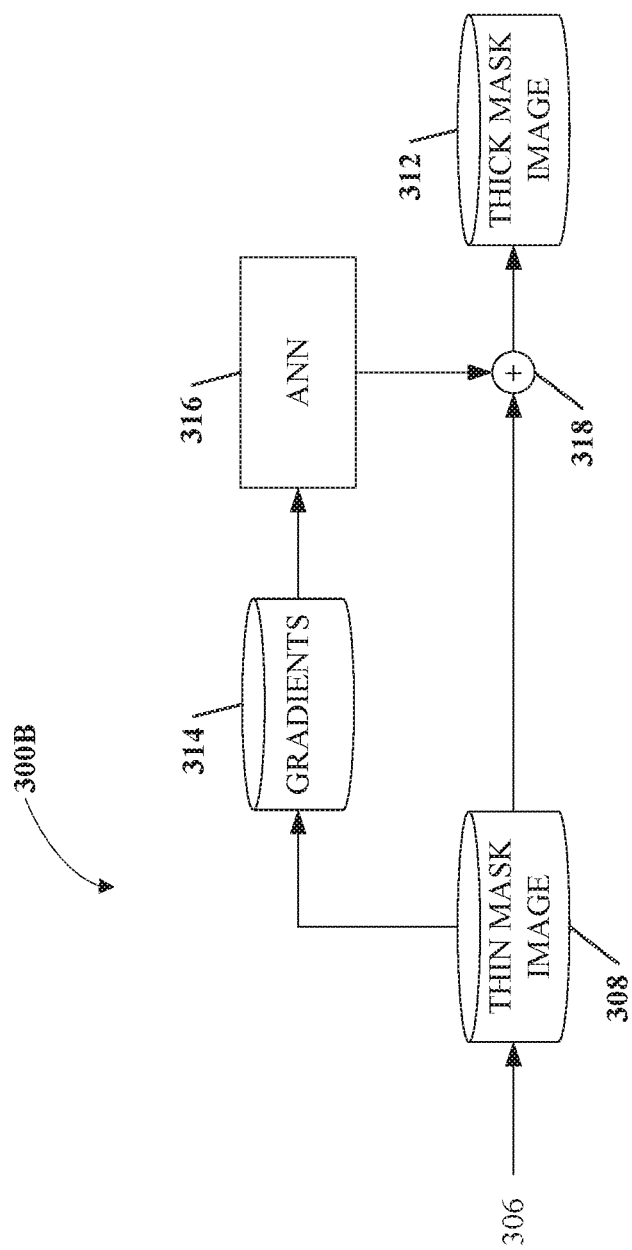
FIG. 3B is a diagram of another example process for determining a near field image according to implementations of this disclosure.

FIG. 3B is a flowchart of another example process 300B for determining a near field image according to implementations of this disclosure. The process 300B can be implemented as software and/or hardware in the apparatus 200 in FIG. 2. For example, the process 300B can be implemented by program codes stored in a memory (e.g., the memory 204). The program codes can include computer-readable instructions that, when executed by a processor (e.g., the processor 202), cause the apparatus to determine the near field image in the manner described in FIG. 3B. The process 300B can also be implemented as specialized hardware included in an apparatus (e.g., the apparatus 200). The process 300B includes data and operations 308-318, which is a variation of the process 300A.

In the process 300B, the thin mask image 308 can be generated in the same way as in the process 300A. The mask topography effect are caused by scattering from mask edges. Mask image gradients (e.g., a vector image) can be determined to represent the edges in the thin mask image 308.

Gradients 314 can be determined from the thin mask image 308. The gradients 314 include one or more vector images. For example, if the thin mask image 308 is a scalar image $MI_{2D}(x,y)$ with (x,y) as coordinates, a gradient of the thin mask image 308 can be determined as $$\nabla MI_{2D}(x, y) = \left( \frac{\partial MI_{2D}}{\partial x}, \frac{\partial MI_{2D}}{\partial y} \right).$$

In addition to the provided example, other forms of the gradients 314 are also possible.

The ANN 316 can take the gradients 314 as input. The ANN 316 can output predicted differences between thin mask images (e.g., the thin mask image 308) and thick mask images (e.g., the thick mask image 312).

At operation 318, the thin mask image 308 can be combined with (e.g., summed with) the outputs of the ANN 316 to output the thick mask image 312.

Optimizations for computational lithography applications, such as OPC, Source-Mask co-Optimization (SMO), and ILT, can use gradients generated based on thick mask images. For example, the thick mask images 312 can be inputted to imaging or models for optimization. The optimization results can be compared with wafer images to calculate a value of a cost function (referred to as a "cost value"). For example, the cost function can include a root-mean-square (RMS) of an error associated with a thick mask image. To tune optimization variables, the gradients of the cost function with respect to the optimization variables can be used. For example, by inverse imaging or process models, gradients of the cost function with respect to a thick mask image can be obtained as $$\frac{\partial Cost}{\partial MI_{3D}},$$

in which $MI_{3D}$ is the thick mask image. For example, $$\frac{\partial Cost}{\partial MI_{3D}}$$

can be evaluated at one or more points of $MI_{3D}$ with respect to image values (e.g., indicative of image intensities, image resolutions, near field intensities, etc.) associated with the points. The optimization variables associated with the thick mask images can be tuned to minimize or maximize the cost in accordance with $$\frac{\partial Cost}{\partial MI_{3D}}.$$

Considering the thick mask images are generated from the thin mask images, tuning optimization variables associated with the thin mask images can be easier. To tune the optimization variables associated with the thin mask images, gradients of the cost function with respect to a thin mask image $$\frac{\partial Cost}{\partial MI_{2D}}$$

can be used, with $MI_{2D}$ as the thin mask image. For example, $$\frac{\partial Cost}{\partial MI_{2D}}$$

can be evaluated at one or more points of $MI_{2D}$ with respect to image values (e.g., indicative of image intensities, image resolutions, etc.) associated with the points. The $$\frac{\partial Cost}{\partial MI_{2D}}$$

can be derived by Eq. (3):

$$\frac{\partial Cost}{\partial MI_{2D}} = \frac{\partial Cost}{\partial MI_{3D}} \cdot \frac{\partial MI_{3D}}{\partial MI_{2D}} \quad (3)$$

Figure 3C:
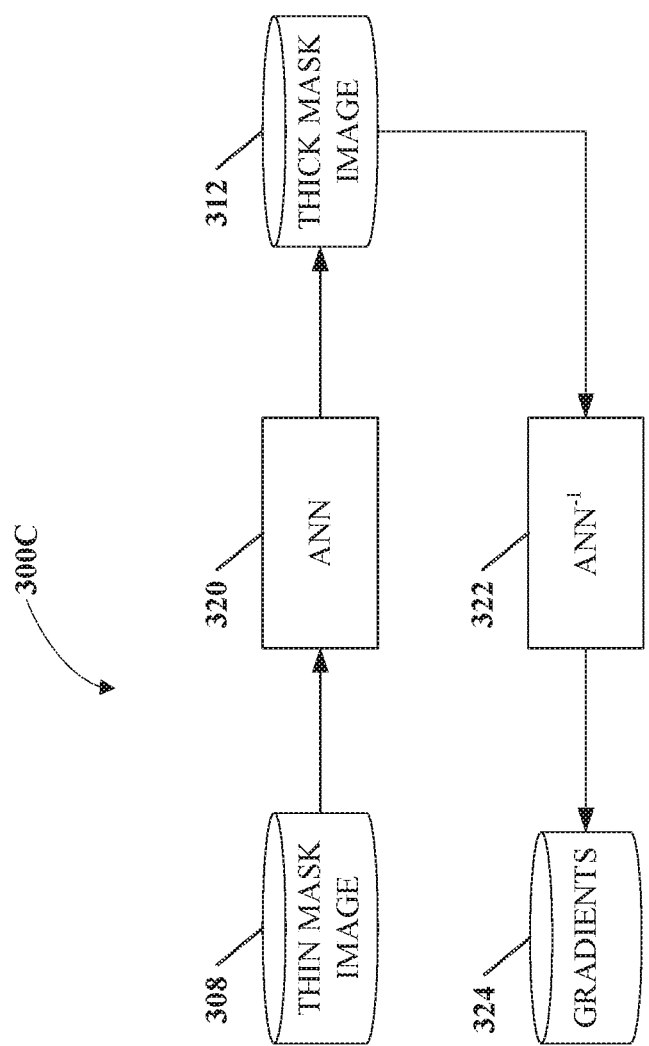
FIG. 3C is a diagram of an example process for determining a near field image and a gradient according to implementations of this disclosure.

To determine $$\frac{\partial MI_{3D}}{\partial MI_{2D}}$$

in Eq. (3), an inverse ANN can be used. FIG. 3C is a diagram of an example process 300C for determining a near field image and a gradient according to implementations of this disclosure. The process 300C can be implemented as software and/or hardware in the apparatus 200 in FIG. 2. For example, the process 300C can be implemented by program codes stored in a memory (e.g., the memory 204). The program codes can include computer-readable instructions that, when executed by a processor (e.g., the processor 202), cause the apparatus to determine the near field image and the gradient in the manner described in FIG. 3C. The process 300C can also be implemented as specialized hardware included in an apparatus (e.g., the apparatus 200). The process 300C includes data and operations 308-324, which is described as follows.

The thick mask image 312 can be determined by an ANN 320. The inputs of the ANN 320 can include a thin mask image 308. The ANN 320 can be similar to the ANN 310 in the process 300A, similar to the ANN 316 in the process 300B, or any other ANN that can determine near field images using think mask images as inputs.

An inverse ANN 322 herein is an ANN model that takes the thick mask image 312 as input and output gradients 324. For example, the gradients 324 can include the $$\frac{\partial MI_{3D}}{\partial MI_{2D}}$$

in Eq. (3).

The inverse ANN 322 can be derived analytically from an original ANN (e.g., the ANN 310 or the ANN 316), or numerically trained from training data.

Figure 4:
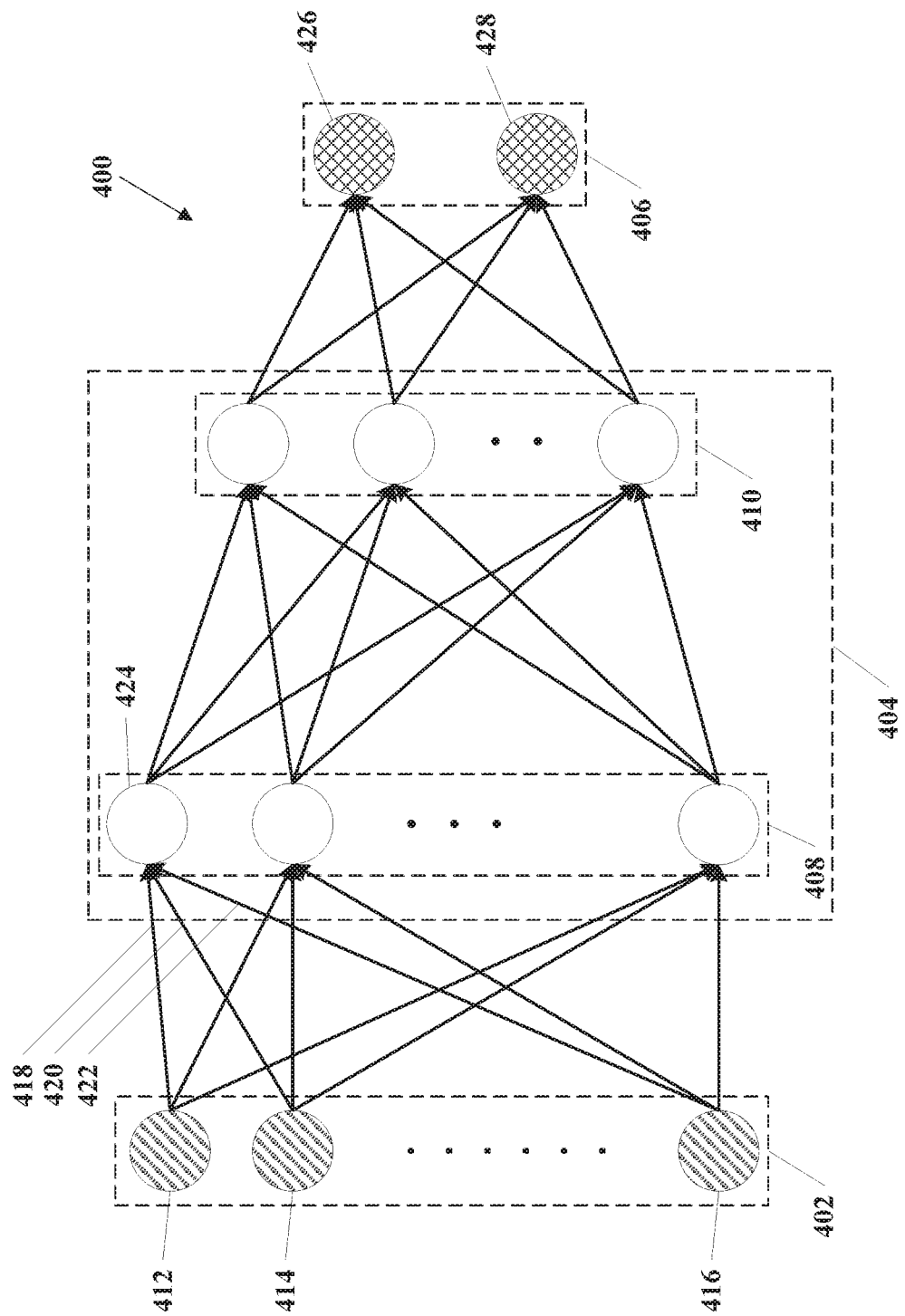
FIG. 4 is a diagram of structures of an example artificial neural network (ANN) according to implementations of this disclosure.

FIG. 4 is a diagram of structures of an example ANN 400 according to implementations of this disclosure. The ANN 400 can be used to determine $MI_{3D}$ using image data of $MI_{2D}$ (e.g., the thin mask images 308, the gradients 314, or a combination thereof) as inputs. The ANN 400 can be implemented in whole or in part as codes and structured data stored in the memory 204 and/or the storage device 206 in the apparatus 200 for photolithography simulation as shown in FIG. 2. In an implementation, the ANN 400 can include an MLP model. In another implementation, the ANN 400 can include a CNN model.

Generally, an ANN can include an input layer, one or more hidden layers, and an output layer, in which each layer includes multiple nodes ("neurons") that can be stored as various data structures (e.g., as arrays of data or executable codes) in a computer memory. Each node of the input layer and the output layer in FIG. 4 is a graphic representation of input data and output data of the ANN, respectively. Each node of the hidden layers in FIG. 4 is a graphic representation of an activation function, which can take multiple values outputted from nodes of a preceding layer as input and generate a single value for inputting into nodes of a succeeding layer. Each input (the values outputted from the nodes of the preceding layer) of a node can carry a weight for the calculation of the activation function of that node, in which the weight can be either the same as or different from other weights carried by other inputs of that node. The input and output relationships between nodes of different layers can be graphically represented by interconnecting directional lines between the nodes of the layers (a "network"), with each directional line carrying a weight. In this example ANN 400: an input layer 402 includes input nodes 412-416; hidden layers 404 includes a first hidden layer 408 and a second hidden layer 410, with each of the hidden layers including one or more nodes; an output layer 406 includes a first output node 426 and a second output node 428. For example, each of the output nodes 426 and 428 can be a weighted sum of the values outputted from the nodes of the hidden layer 410. Directional lines between nodes of different layers of the ANN 400 graphically represent the network, with arrows at ends of the directional lines indicative of the direction of inputting and outputting ("propagation direction") of the ANN 400. For example, a hidden layer node 424 of the hidden layer 408 can take values outputted from the input nodes 412-416 as input and generate a single value for inputting into nodes of the hidden layer 410, in which the values outputted from the input nodes 412, 414, and 416 respectively carry weights 418, 420, and 422 for the calculation of the activation function of the hidden layer node 424.

If the ANN 400 is implemented as an MLP model, each node in each layer of the ANN 400 is connected to each node in the consecutive layer (referred to as "fully connected"). For nodes in the hidden layers (e.g., the first hidden layer 408 and the second hidden layer 410), each neuron of the hidden layers can have an activation function (e.g., a non-linear activation function).

If the ANN 400 is implemented as a CNN model, the layers of the ANN 400 can include one or more of the following layers: input layers, convolutional layers, fully connected layers, and output layers. The CNN model can generally include two parts: a feature extractor and a classifier. A convolutional layer can use a small matrix (referred to as a "filter" or a "kernel") to compute dot products (referred to as "convolving") with subsets of its previous layer (including the input layer) to extract features of the previous layer. Multiple convolutional layers can be used to extract different features of the input. A fully connected layer, similar to the MLP model, can be used as a classifier to classify its inputs into predetermined classes (including the output layer). Optionally, the CNN model can further include one or more of Rectified Linear Unit (referred to as "ReLU") layers and pooling (referred to as "POOL") layers, interlaced with the convolutional layers before the fully connected layers. The ReLU layers can introduce non-linearity into the CNN model to simulate non-linearity, and the POOL layers can down-sample the hidden layers to reduce layer dimensions for computation cost reduction. For example, if the ANN 400 is the CNN model, the first hidden layer 408 can be a convolutional layer and the second hidden layer 410 can be a fully connected layer. One or more other types of layers can be arranged between the first hidden layer 408 and the second hidden layer 410.

In some implementations, each of the input nodes 412-416 can include image data associated with at least one point in $MI_{2D}$. For example, if the ANN 400 (e.g., the ANN 310) uses $MI_{2D}$ (e.g., the thin mask image 308) as inputs, the image data can include image intensities (e.g., pixel values of a grey-scaled thin mask image), with each input node in the input layer 402 indicative of an image intensity at a point sampled in $MI_{2D}$. For another example, if the ANN 400 (e.g., the ANN 316) uses gradients of $MI_{2D}$ (e.g., the gradients 314) as inputs, the image data can include values of a vector image, with each input node in the input layer 402 indicative of a value of the vector image at a point sampled in $MI_{2D}$. The points sampled in $MI_{2D}$ can be sampled by a sampling scheme.

Figure 5:
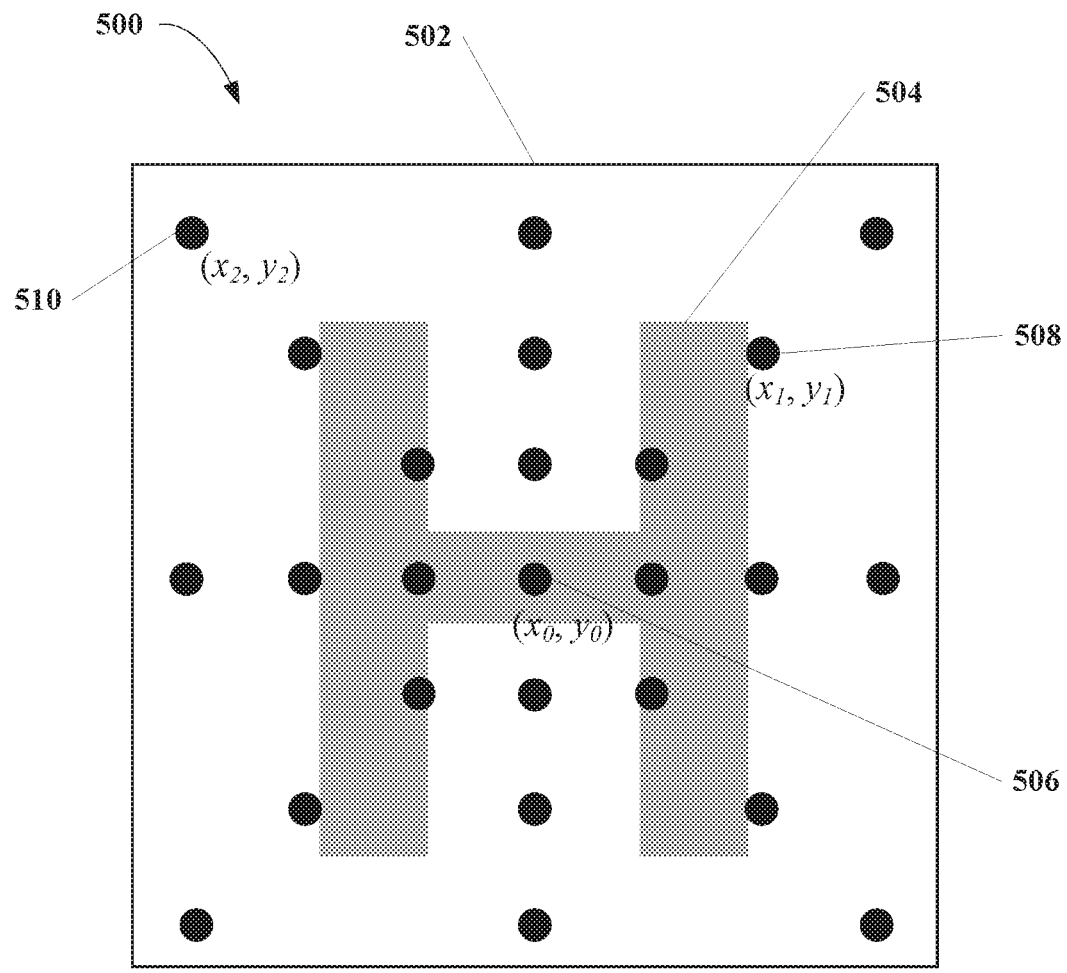
FIG. 5 is a diagram of an example sampling scheme used for sampled points in a thin mask image according to implementations of this disclosure.

FIG. 5 is a diagram showing an example sampling scheme 500 used for sampled points in a sampling region 502 with a mask pattern 504 according to implementations of this disclosure. The sampling region 502 can be at least a portion of $MI_{2D}$. The black round dots in the sampling scheme 500 represent the points sampled in the sampling region 502. In some implementations, for predicting location and amplitude/phase information in $MI_{3D}$ for a first point sampled in $MI_{2D}$, only points within a predetermined distance to the first point are sampled. In an implementation, a concentric circle area sampling (CCAS) scheme can be used, in which the sampled points are circularly concentric with respect to a centered sampled point in different distances. In another implementation, a concentric square sampling (CSS) scheme can be used, in which the sampled points are squarely concentric with respect to a centered sampled point in different distances. In another implementation, a uniform sampling scheme can be used, in which the sampled points are uniformly distributed in the sampling region. Any combination of CCAS, CSS, and other sampling schemes are also possible. Each of the sampled points can have coordinates (e.g., Cartesian coordinates or polar coordinates).

In FIG. 5, sampled points 506, 508, and 510 have coordinates $(x_0,y_0)$, $(x_1,y_1)$, and $(x_2,y_2)$, respectively. For example, the image data included in the input nodes 412, 414, and 416 can be the image intensities at coordinates $(x_0,y_0)$, $(x_1,y_1)$, and $(x_2,y_2)$, respectively. For another example, the image data included in the input nodes 412, 414, and 416 can be values of a vector image at coordinates $(x_0,y_0)$, $(x_1,y_1)$, and $(x_2,y_2)$, respectively. The image intensities or the vector image values at the sampled points in the sampling region can be referred to as "inputs" hereinafter for ease of explanation without causing ambiguity. To determine image data (e.g., image intensity) of a predicted point 506' (not shown) in $MI_{3D}$ corresponding to the sampled point 506, the inputs of the sampled points in the sampling scheme 500 can be inputted into the ANN 400 for processing. For each node of a layer succeeding the input layer 402 (e.g., the hidden layer 408), different weights can be assigned to the inputs of the sampled points for calculation of the activation function of that node. In some implementations, the weights carried by the inputs of the sampled points can be associated with intensities of interactions or interferences (e.g., edge-to-edge, edge-to-corner, and corner-to-corner interactions) between the sampled point 506 and other sampled points. Intensity of interaction between two sampled points can decrease as a distance between them increases. For example, to determine the image data of the predicted point 506' in $MI_{3D}$, the weight 418 carried by the input node 412 (corresponding to the sampled point 506) can be greater or equal to the weight 420 carried by the input node 414 (corresponding to the sampled point 508). In addition, the weight 418 can be greater or equal to the weight 422 carried by the input node 416 (corresponding to the sampled point 510), based on that a distance between the sampled point 506 and 508 is smaller than a distance between the sampled point 506 and 510.

Refer back to FIG. 4, the output nodes 426 and 428 can represent image data of points predicted in $MI_{3D}$ with mask topography effects considered. In some implementations, the image data of the predicted point can be complex-valued to account for both amplitude modulations and phase shifts of the near field, which can be indicative of interactions between incident light and the mask topography. For example, the output node 426 can represent real parts of coordinates of a point predicted in $MI_{3D}$, and the output node 428 can represent imaginary parts of the coordinates of the point predicted in $MI_{3D}$.

Depending on precision and time constraint in computation of the ANN, parameters of the ANN 400 (e.g., numbers of hidden layers, numbers of nodes in each hidden layer, design of interconnection between nodes, weights associated with interconnections, and activation functions of the nodes) and parameters for determining the inputted image data (e.g., sampling scopes, sampling schemes, number of sampled points, and sampling data types) can be set and/or adjusted correspondingly. It should be understood that the two hidden layers 408 and 410 as shown in the ANN 400 is for illustration only, and the number of the hidden layers of the ANN 400 can be more or less than two. It should also be understood that reasonable experiments can be performed to determine the parameters of the ANN and the parameters for determining the geometric data, such as, for example, the sampling schemes and designs of the network or hidden layers of the ANN.

In some implementations, the parameters of the ANN 400 can be determined (e.g., initialized or updated) through a training process. A training data set can be used, which can include a set of thin mask images with different mask patterns. The training process can be recursively performed for each of the thin mask image in the training data set until a requirement is met.

Figure 6:
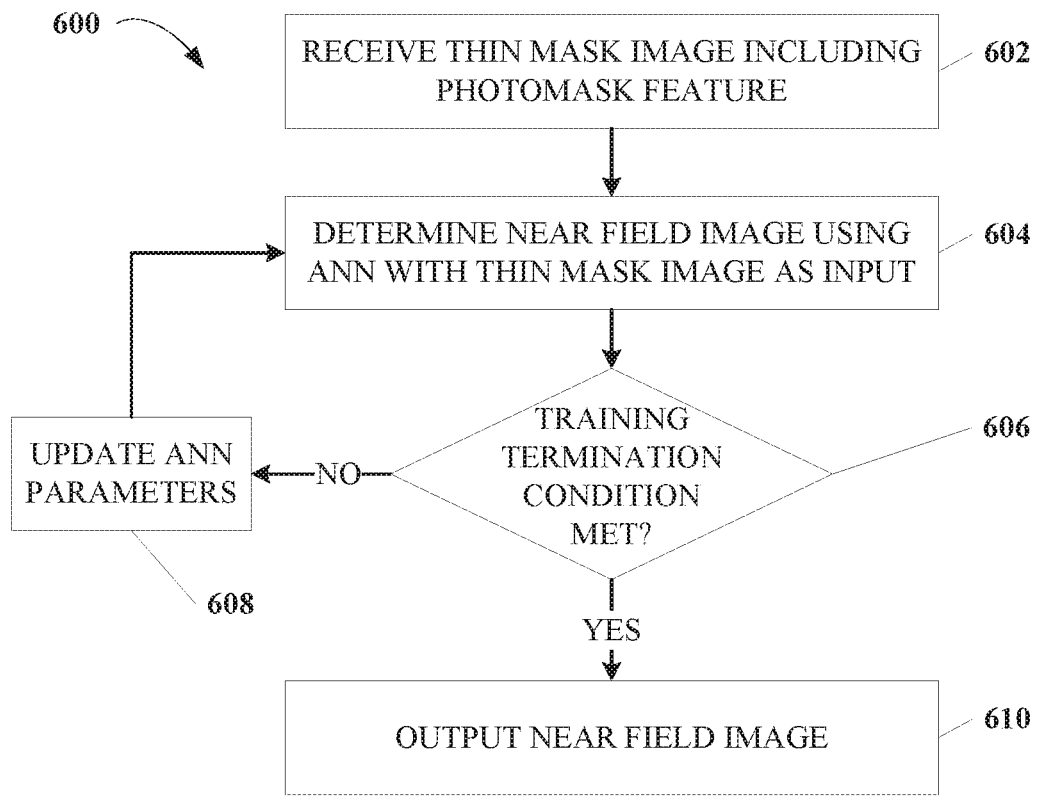
FIG. 6 is a flowchart of an example process for training an ANN according to some implementations of this disclosure.

FIG. 6 is a flowchart of an example process 600 for training an ANN according to some implementations of this disclosure. The ANN can be used to determine the geometric data using image data of a thin mask image ($MI_{2D}'$) as input. The process 600 can be implemented as software and/or hardware in the apparatus 200 in FIG. 2. For example, the process 600 can be implemented by program codes stored in a memory (e.g., the memory 204). The program codes can include computer-readable instructions that, when executed by a processor (e.g., the processor 202), cause the apparatus to train the ANN in the manner described in FIG. 6. The process 600 can also be implemented as specialized hardware included in an apparatus (e.g., the apparatus 200). The process 600 includes operations 602-608, which will be described as follows.

At operation 602, $MI_{2D}'$ including a photomask feature is received. The term "receive" used herein can refer to receiving, inputting, acquiring, retrieving, obtaining, reading, accessing, or any action in any manner for inputting information or data. The photomask feature can include a known mask pattern included in mask design layout data. For example, the photomask feature can include a mask pattern, an edge of the mask pattern, a corner of the mask pattern, an area of the mask pattern, or any combination thereof. $MI_{2D}'$ can be determined from mask design layout data without considering the mask topography effect associated with the photomask feature. The mask design layout data can include geometric information of mask patterns. The mask design layout data can also be stored as one or more computerized data files in a system. In some implementations, the mask design layout can include or be converted to a series of polygons. For example, the mask design layout data (e.g., polygons) can be rendered by the render filters 304 in the process 300A by various standard render filters (e.g., a low-pass filter), followed by rasterization. $MI_{2D}'$ can carry information of all edges and corners as well as their neighboring features of mask patterns.

In some implementations, multiple thin mask images including defined mask patterns/features (e.g., edges, corners or other shapes) can be included in the training data set.

At operation 604, a near field image ($MI_{3D}'$) is determined from $MI_{2D}'$ using an ANN. The ANN can use image data of $MI_{2D}'$ as inputs. The image data of $MI_{2D}'$ can include geometries (e.g., edges or corners), coordinates of sampled points in $MI_{2D}'$, image intensities at the sampled points, or any other image related data derived from $MI_{2D}'$. For example, the image data can include $MI_{2D}'$ itself as input (e.g., as the ANN 310) to determine $MI_{3D}'$. The image data of $MI_{2D}'$ can also include any feature or characteristic derived/extracted from $MI_{2D}'$. For example, the ANN can also take a gradient (e.g., a vector image) of $MI_{2D}'$ as input (e.g., as the ANN 316). The near field image $MI_{3D}'$ can be determined directly or indirectly from $MI_{2D}'$, as will be discussed below.

In an implementation, the ANN can use image intensity at points sampled in $MI_{2D}'$ as input. The points can be sampled in accordance with a sampling scheme (e.g., the sampling scheme shown in FIG. 5). For another example, the sampling scheme can be a CCAS, CSS, or a uniform sampling scheme.

$MI_{3D}'$ outputted by the ANN can include a real value, a complex value, a pair of real values indicative of a complex number, or a combination thereof. In some implementations, $MI_{3D}'$ can be complex-valued to account for both amplitude modulations and phase shifts induced by interactions between the incident light and the mask topography. In some implementations, weights associated with ANN nodes can account for inter-geometry (e.g., edge-to-edge, edge-to-corner, and/or corner-to-corner) interactions between locations of the corresponding sampled points. For example, the weights can include weights associated with the sampled points (e.g., the weights 418-422 in FIG. 4), the image intensities of which are used in the input layer of the ANN. Parameters of the ANN (referred to as "ANN parameters") can be assigned with default values. The ANN parameters can include numbers of hidden layers, numbers of nodes in each hidden layer, weights associated with the ANN nodes, or any combination thereof.

At operation 606, it is determined whether a training termination condition is met. In an implementation, the training termination condition can be that a cost value associated with $MI_{3D}'$ is minimized (e.g., locally or globally). In this implementation, the training process 600 can be implemented as an optimization process which minimizes the cost value. For example, the cost value can be an RMS of errors of the thin mask images in the training data set. The gradient can include one or more gradients as described in FIGS. 3A-3C

$$\left(e.g., \frac{\partial Cost}{\partial MI_{3D}}\right).$$

In an example, the cost value can be considered as minimized when a gradient of the cost value reaches or approaches to zero. For example, the operation 606 can be performed as determining whether the gradient of the cost value is sufficiently close to zero (e.g., within a numerical precision of a computer system).

In another implementation, the training termination condition can be that there is a match between the determined $MI_{3D}'$ and a defined image (a "template image"). The template image can be a near field image indicative of the same photomask feature considering mask topographical effects. The template image can have a simulation accuracy higher than or equal to a simulation accuracy of the determined $MI_{3D}'$. The template image can be determined using a different method. In some implementations, the different method can include rigorous solvers and/or the library-based approach.

For example, the operation 606 can be performed as determining whether an accuracy requirement is met. If the accuracy requirement is met (referred to as a "match"), the process 600 can proceed to operation 610. Otherwise, the process 600 can proceed to operation 608. The accuracy requirement can be any similarity requirement for comparing $MI_{3D}'$ and the template image. The accuracy requirement can be determined by various techniques, such as, for example, key point matching, histogram statistics, or a learning method (e.g., a decision tree). In some implementations, the similarity between the $MI_{3D}'$ and the template image can be calculated as a value (referred to as a "similarity value") and the accuracy requirement can be implemented as a threshold model or an error tolerance model based on the similarity values. For example, the accuracy requirement can be deemed as met if the similarity value is greater than or equal to a predetermined threshold value. If otherwise, the accuracy requirement can be deemed as not met.

If the training termination condition is not met, the ANN parameters are updated at operation 608, then the process 600 goes back to the operation 604 to determine $MI_{3D}'$ again using the ANN with the updated ANN parameters. The ANN parameters are updated to make the next predicted $MI_{3D}'$ more accurate (more similar to the template image). For example, a gradient descent method can be used to update the ANN parameters. In an implementation, the weights of the ANN (e.g., the weights 418-422 in FIG. 4) can be updated. In another implementation, in addition to the weights, additional ANN parameters can also be updated. For example, the additional ANN parameters can include the structure of the ANN (e.g., the structure of hidden layers), the number of the hidden layers, and the number of the nodes in a hidden layer.

The operations 604-608 can be iterated until the training termination condition is met. In addition, an additional termination condition can be used at the operation 606. The additional termination condition can be used to terminate the iteration in case the match cannot be reached or the cost value cannot be minimized in a reasonable time period. For example, the additional termination condition can be set as the iterations of 604-608 exceeding a predetermined number or the time for the iterations exceeding a time threshold.

At operation 610, $MI_{3D}'$ is outputted for use in photolithography simulations. For example, $MI_{3D}'$ can be inputted to the inverse ANN 322 in the process 300C to determine the gradients 324.

Figure 7:
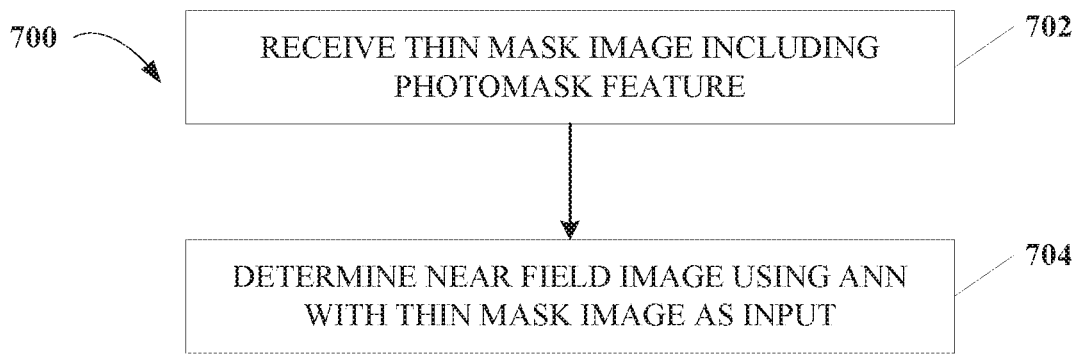
FIG. 7 is a flowchart of an example process for determining a near field image using an ANN according to implementations of this disclosure.

After the ANN is trained, new thin mask images associated with unknown mask patterns can be inputted into the trained ANN to determine corresponding near field images. By using the ANN method, the near field images can be determined for mask patterns with arbitrarily oriented edges and various feature sizes and proximities. The ANN method can deal with the angular dependency and feature-size dependency of the mask topographical effects. By using thin mask images as input, the ANN method can reduce cost in time and computation, without compromising accuracy of the predicted near field images. FIG. 7 is a flowchart of a process 700 for determining a near field image ($MI_{3D}$) using an ANN with a thin mask image ($MI_{2D}$) as an input according to implementations of this disclosure. The process 700 can be implemented as software and/or hardware in the apparatus 200 in FIG. 2. For example, the process 700 can be implemented by program codes stored in a memory (e.g., the memory 204). The program codes can include computer-readable instructions that, when executed by a processor (e.g., the processor 202), cause the apparatus to determine $MI_{3D}$ using the ANN in the manner described in FIG. 7. The process 700 can also be implemented as specialized hardware included in an apparatus (e.g., the apparatus 200). The process 700 includes operations 702-704, which will be described as follows.

At operation 702, $MI_{2D}$ indicative of a photomask feature is received. The operation 702 can be similar to the operation 602 in FIG. 6. The photomask feature can include a mask pattern, an edge of the mask pattern, a corner of the mask pattern, an area of the mask pattern, or any combination thereof.

At operation 704, $MI_{3D}$ is determined using the ANN. This operation can be similar to the operation 604 in FIG. 6. The ANN can include a MLP model, a CNN model, or any other ANN model. In some implementations, weights can be assigned to the image data (e.g., at the sampled points). For example, the weights (e.g., the weights 418-422 in FIG. 4) can be determined based on distances between the sampled points as described in FIGS. 4-5.

The ANN (e.g., the ANN 310) can take $MI_{2D}$ as input directly or indirectly to determine $MI_{3D}$. Examples of using $MI_{2D}$ indirectly to determine $MI_{3D}$ can include, for example, by adding $MI_{2D}$ (e.g., the thin mask image 308 in FIG. 3B) to outputs of the ANN (e.g., the ANN 316). In this example, the ANN can use values of a vector image (e.g., the gradients 314 determined from $MI_{2D}$) as input. The outputs of the ANN can be indicative of difference between $MI_{2D}$ and $MI_{3D}$. For example, the operation 704 can be similar to the operation 318 in FIG. 3B.

Examples of using $MI_{2D}$ indirectly to determine $MI_{3D}$ can also include, for example, using image data of $MI_{2D}$ (e.g., in addition to or in place of $MI_{2D}$ itself) as input. For example, the image data of $MI_{2D}$ can include image data (e.g., image intensity) of multiple sampled points sampled in $MI_{2D}$ in accordance with a sampling scheme (e.g., CCAS, CSS, or uniform sampling).

Similar to the operation 610, $MI_{3D}$ can include a complex value. In addition to the operation 704, gradient data associated with $MI_{3D}$ (e.g., the gradients 324 in FIG. 3C) can be further determined. For example, the gradient data can include a gradient of $MI_{3D}$ with respect to $MI_{2D}$.

Figure 8:
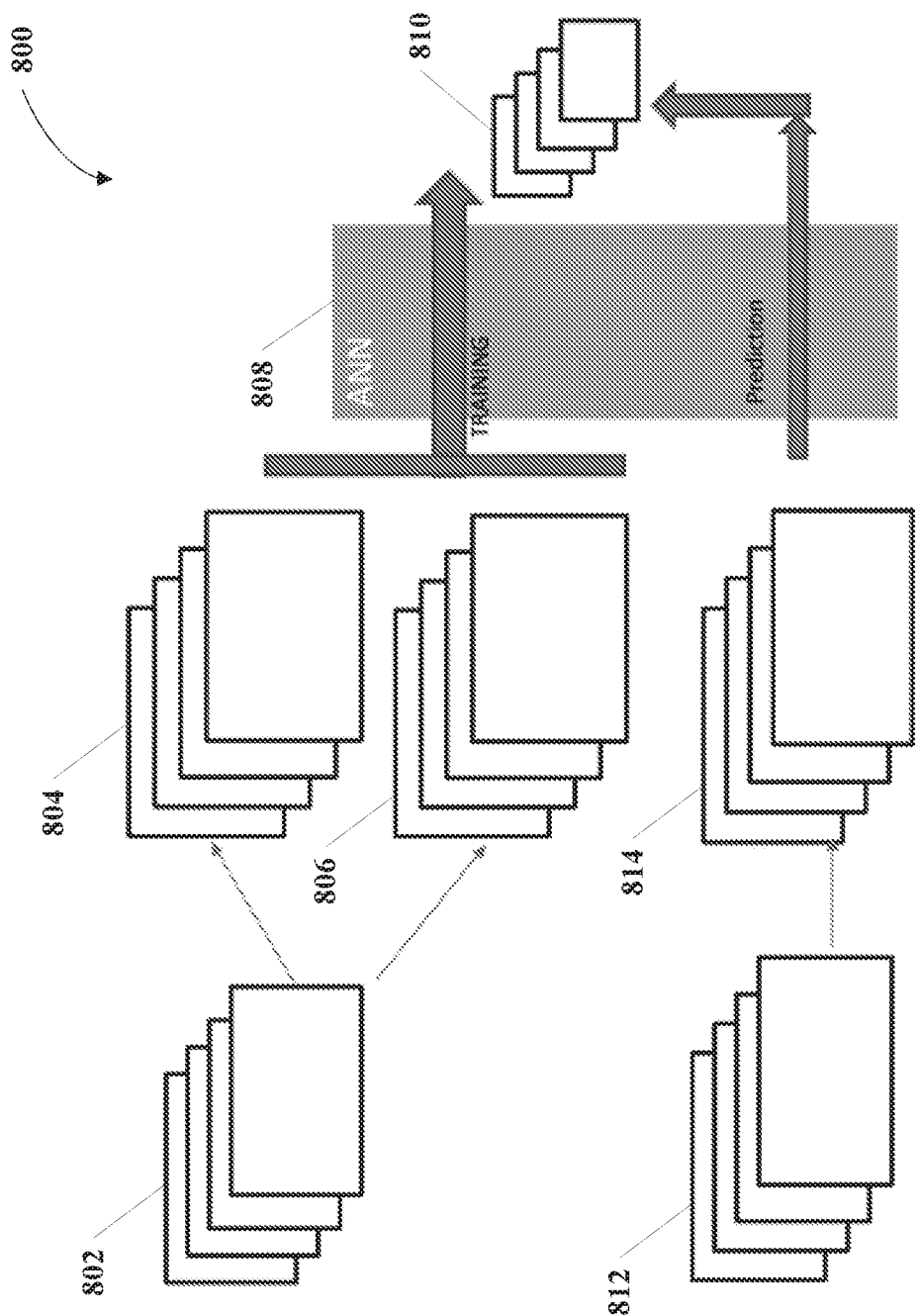
FIG. 8 is a diagram of an example process 800 using an ANN according to implementations of this disclosure.

FIG. 8 is a diagram of an example process 800 using an ANN with a training process and a prediction process according to implementations of this disclosure.

The training process of the process 800 includes elements 802-810. A training data set 802 can include training patterns (e.g., polygons included in mask design layout) that are used for training the ANN 808. The training patterns can be rendered to generate thin mask images 804 (e.g., through the operation 306 in FIG. 3A), and the same training patterns can be used to determine template images 806 (e.g., through simulations using the rigorous solvers). The ANN 808 can determine near field images 810 using the thin mask images 804 as input. For example, the input layers of the ANN 808 can take geometric data (e.g., coordinates of a sampled point) associated with a photomask feature determined from at least one point in the thin mask images 804 as input. If the determined near field images 810 do not match with the template images 806, parameters of the ANN 808 can be updated, and the near field images 810 can be determined again using thin mask images 804 as input until the near field images 810 match with the template images 806.

The prediction process of the process 800 includes a testing data set 812, thin mask images 814, the ANN 808, and the near field images 810. The testing data set 812 can include test patterns (e.g., polygons included in mask design layout) that can be used in production environment. The testing patterns can be rendered to generate the thin mask images 814, similar to the generation of the thin mask image 804. With the ANN 808 trained in the training process, the near field images 810 can be determined using the thin mask images 804 as input.

The implementations herein may be described in terms of functional block components and various processing steps. The disclosed processes and sequences may be performed alone or in any combination. Functional blocks may be realized by any number of hardware and/or software components that perform the specified functions. For example, the described implementations may employ various integrated circuit components, e.g., memory elements, processing elements, logic elements, look-up tables, and the like, which may carry out a variety of functions under the control of one or more microprocessors or other control devices. Similarly, where the elements of the described implementations are implemented using software programming or software elements the disclosure may be implemented with any programming or scripting language such as C, C++, Java, assembler, or the like, with the various algorithms being implemented with any combination of data structures, objects, processes, routines or other programming elements. Functional aspects may be implemented in algorithms that execute on one or more processors. Furthermore, the implementations of the disclosure could employ any number of conventional techniques for electronics configuration, signal processing and/or control, data processing and the like.

Aspects or portions of aspects of the above disclosure can take the form of a computer program product accessible from, for example, a computer-usable or computer-readable medium. A computer-usable or computer-readable medium can be any device that can, for example, tangibly contain, store, communicate, or transport a program or data structure for use by or in connection with any processor. The medium can be, for example, an electronic, magnetic, optical, electromagnetic, or a semiconductor device. Other suitable mediums are also available. Such computer-usable or computer-readable media can be referred to as non-transitory memory or media. A memory of a system described herein, unless otherwise specified, does not have to be physically contained by the system, but is one that can be accessed remotely by the system, and does not have to be contiguous with other memory that might be physically contained by the system.

The word "example" is used herein to mean serving as an example, instance, or illustration. Any aspect or design described herein as "example" is not necessarily to be construed as preferred or advantageous over other aspects or designs. Rather, use of the word "example" is intended to present concepts in a concrete fashion. As used in this application, the term "or" is intended to mean an inclusive "or" rather than an exclusive "or". That is, unless specified otherwise, or clear from context, "X includes A or B" is intended to mean any of the natural inclusive permutations. In other words, if X includes A; X includes B; or X includes both A and B, then "X includes A or B" is satisfied under any of the foregoing instances. In addition, the articles "a" and "an" as used in this application and the appended claims should generally be construed to mean "one or more" unless specified otherwise or clear from context to be directed to a singular form. Moreover, use of the term "an aspect" or "one aspect" throughout is not intended to mean the same implementation or aspect unless described as such.

The particular aspects shown and described herein are illustrative examples of the disclosure and are not intended to otherwise limit the scope of the disclosure in any way. For the sake of brevity, conventional electronics, control systems, software development and other functional aspects of the systems (and components of the individual operating components of the systems) may not be described in detail. Furthermore, the connecting lines, or connectors shown in the various figures presented are intended to represent exemplary functional relationships and/or physical or logical couplings between the various elements. Many alternative or additional functional relationships, physical connections or logical connections may be present in a practical device.

The use of "including" or "having" and variations thereof herein is meant to encompass the items listed thereafter and equivalents thereof as well as additional items. Unless specified or limited otherwise, the terms "mounted," "connected," 'supported," and "coupled" and variations thereof are used broadly and encompass both direct and indirect mountings, connections, supports, and couplings. Further, "connected" and "coupled" are not restricted to physical or mechanical connections or couplings.

The use of the terms "a" and "an" and "the" and similar referents in the context of describing the disclosure (especially in the context of the following claims) should be construed to cover both the singular and the plural. Furthermore, recitation of ranges of values herein are merely intended to serve as a shorthand method of referring individually to each separate value falling within the range, unless otherwise indicated herein, and each separate value is incorporated into the specification as if it were individually recited herein. Finally, the steps of all methods described herein are performable in any suitable order unless otherwise indicated herein or otherwise clearly contradicted by context. The use of any and all examples, or exemplary language (e.g., "such as") provided herein, is intended merely to better illuminate the disclosure and does not pose a limitation on the scope of the disclosure unless otherwise claimed.

While the disclosure has been described in connection with certain implementations, it is to be understood that the disclosure is not to be limited to the disclosed implementations but, on the contrary, is intended to cover various modifications and equivalent arrangements included within the scope of the appended claims, which scope is to be accorded the broadest interpretation so as to encompass all such modifications and equivalent structures as is permitted under the law.

What is claimed is:

1. A method for determining a near field image for optical lithography, the method comprising:
    receiving data regarding a thin mask image, wherein the thin mask image is indicative of a photomask feature and determined without considering a mask topography effect associated with the photomask feature; and
    determining, from the thin mask image by a hardware processor, a near field image using an artificial neural network (ANN), wherein the ANN receives data with respect to the thin mask image as input and outputs information regarding, or accounting for, a mask topography effect associated with the photomask feature.

2. The method of claim 1, wherein the photomask feature comprises at least one selected from: a mask pattern, an edge of the mask pattern, a corner of the mask pattern, and/or an area of the mask pattern.

3. The method of claim 1, wherein determining the near field image using the ANN comprises determining the near field image by adding data with respect to the thin mask image to outputs of the ANN, wherein the outputs are indicative of a difference between the thin mask image and the near field image and the ANN uses a vector image determined from the thin mask image as input.

4. The method of claim 1, wherein
    the ANN comprises a multilayer perceptron (MLP) model and/or a convolutional neural network (CNN) model,
    input data for the ANN comprises image data of a sampled point in the thin mask image, and
    the image data comprises image intensity of the thin mask image at the sampled point, and/or a value of a vector image determined from the thin mask image.

5. The method of claim 4, wherein the multiple sampled points in the thin mask image are sampled in accordance with a sampling scheme comprising a concentric circle area sampling (CCAS), a concentric square sampling (CSS), or a uniform sampling.

6. The method of claim 5, wherein parameters associated with the ANN comprises a weight associated with the sampled point and the weight is determined based on a distance between the sampled point and another sampled point of the multiple sampled points.

7. The method of claim 1, further comprising:
determining whether a match exists between the near field image determined using the ANN and a defined image indicative of the photomask feature, wherein the defined image is determined using a rigorous electromagnetic simulation technique; and
based on a determination that no match exists between the near field image and the defined image, updating parameters associated with the ANN.

8. The method of claim 1, wherein the ANN has parameters and further comprising:
determining whether a cost value associated with the near field image is minimized; and
based on a determination that the cost value associated with the near field image is not minimized, updating the parameters associated with the ANN.

9. The method of claim 1, wherein the near field image comprises a complex value.

10. The method of claim 1, wherein determining the near field image using the ANN comprises determining gradient data associated with the near field image, wherein the gradient data comprises a gradient of the near field image with respect to the thin mask image.

11. The method of claim 1, further comprising performing a photolithography simulation based on the near field image to determine an aerial image.

12. A non-transitory computer-readable medium storing a set of instructions which, when executed by an apparatus using a processor, become operational with the processor to cause the apparatus to at least:
receive data regarding a thin mask image, wherein the thin mask image is indicative of a photomask feature and determined without considering a mask topography effect associated with the photomask feature, the photomask feature comprising at least one selected from: a mask pattern, an edge of the mask pattern, a corner of the mask pattern, and/or an area of the mask pattern; and
determine, from the thin mask image, a near field image for optical lithography using an artificial neural network (ANN), wherein the ANN uses data with respect to the thin mask image as input.

13. The non-transitory computer-readable medium of claim 12, wherein the instructions to determine the near field image using the ANN further comprise instructions to determine the near field image by adding data with respect to the thin mask image to outputs of the ANN, wherein the outputs are indicative of a difference between the thin mask image and the near field image and the ANN uses a vector image determined from the thin mask image as input.

14. The non-transitory computer-readable medium of claim 12, wherein:
input data for the ANN comprises image data of a sampled point sampled in the thin mask image, and
the image data comprises image intensity of the thin mask image at the sampled point, and/or a value of a vector image determined from the thin mask image.

15. The non-transitory computer-readable medium of claim 14, wherein multiple sampled points in the thin mask image are sampled in accordance with a sampling scheme comprising a concentric circle area sampling (CCAS), a concentric square sampling (CSS), or a uniform sampling.

16. The non-transitory computer-readable medium of claim 14, wherein parameters associated with the ANN comprises a weight associated with the sampled point and the weight is determined based on a distance between the sampled point and another sampled point of multiple sampled points in the thin mask image.

17. The non-transitory computer-readable medium of claim 12, wherein the ANN has parameters and further comprising instructions to cause the apparatus to:
determine whether a cost value associated with the near field image is minimized; and
based on a determination that the cost value associated with the near field image is not minimized, update the parameters associated with the ANN.

18. The non-transitory computer-readable medium of claim 12, wherein the instructions to determine the near field image using the ANN further comprise instructions to cause the apparatus to determine gradient data associated with the near field image, wherein the gradient data comprises a gradient of the near field image with respect to the thin mask image.

19. The non-transitory computer-readable medium of claim 12, wherein the ANN comprises a multilayer perceptron (MLP) model and/or a convolutional neural network (CNN) model.

20. The non-transitory computer-readable medium of claim 12, further comprising instructions to cause the apparatus to:
determine whether a match exists between the near field image determined using the ANN and a defined image indicative of the photomask feature, wherein the defined image is determined using a rigorous electromagnetic simulation technique; and
based on a determination that no match exists between the near field image and the defined image, update parameters associated with the ANN.

21. The non-transitory computer-readable medium of claim 12, further comprising instructions to cause the apparatus to perform a photolithography simulation based on the near field image to determine an aerial image.

* * * * *